United States Patent
Yamauchi et al.

(10) Patent No.: US 6,754,554 B2
(45) Date of Patent: Jun. 22, 2004

(54) SEMICONDUCTOR MANUFACTURING APPARATUS DETECTING STATE OF CONNECTION BETWEEN CONTROLLERS

(75) Inventors: Toru Yamauchi, Fuchu (JP); Kiminori Okada, Fuchu (JP); Tadahito Nezu, Fuchu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/297,985

(22) PCT Filed: Jun. 14, 2001

(86) PCT No.: PCT/JP01/05059

§ 371 (c)(1),
(2), (4) Date: Dec. 12, 2002

(87) PCT Pub. No.: WO01/97262

PCT Pub. Date: Dec. 20, 2001

(65) Prior Publication Data

US 2003/0182012 A1 Sep. 25, 2003

(30) Foreign Application Priority Data

Jun. 16, 2000 (JP) ........................................ 2000-181972

(51) Int. Cl.$^7$ .............................................. G06F 19/00
(52) U.S. Cl. ........................ 700/121; 700/95; 700/117
(58) Field of Search .............................. 700/40–43, 90, 700/95, 117, 121, 114; 711/114; 438/5

(56) References Cited

U.S. PATENT DOCUMENTS 6,466,838 B1 * 10/2002 Aoki ........................... 700/121

6,546,307 B1 * 4/2003 Hsiao ........................... 700/121

FOREIGN PATENT DOCUMENTS

| JP | 6-252244 | 9/1994 |
| JP | 10-124322 | 5/1998 |
| JP | 11-175142 | 7/1999 |
| JP | 11-238659 | 8/1999 |

* cited by examiner

Primary Examiner—Jayprakash N. Gandhi
(74) Attorney, Agent, or Firm—Crowell & Moring LLP

(57) ABSTRACT

An interlock system can discriminate a controller in which an abnormality occurs in a control system of a semiconductor manufacturing apparatus in which a plurality of controllers are connected through a network. A processing system contains at least one processing chamber which performs a semiconductor manufacturing process. A conveyance system takes an object to be processed in and out of the processing chamber. The control system includes at least one apparatus controller, which controls the processing system and the conveyance system, and an equipment controller, which manages the apparatus controller. The apparatus controller and the equipment controller are communicably connected through a network. The apparatus controller and the equipment controller are also connected via a hard wire so as to transmit a status signal of the apparatus controller and the equipment controller to the control system so that a presence of each apparatus controller and a status of connection between the controllers can be detected without using communication through the network.

9 Claims, 8 Drawing Sheets

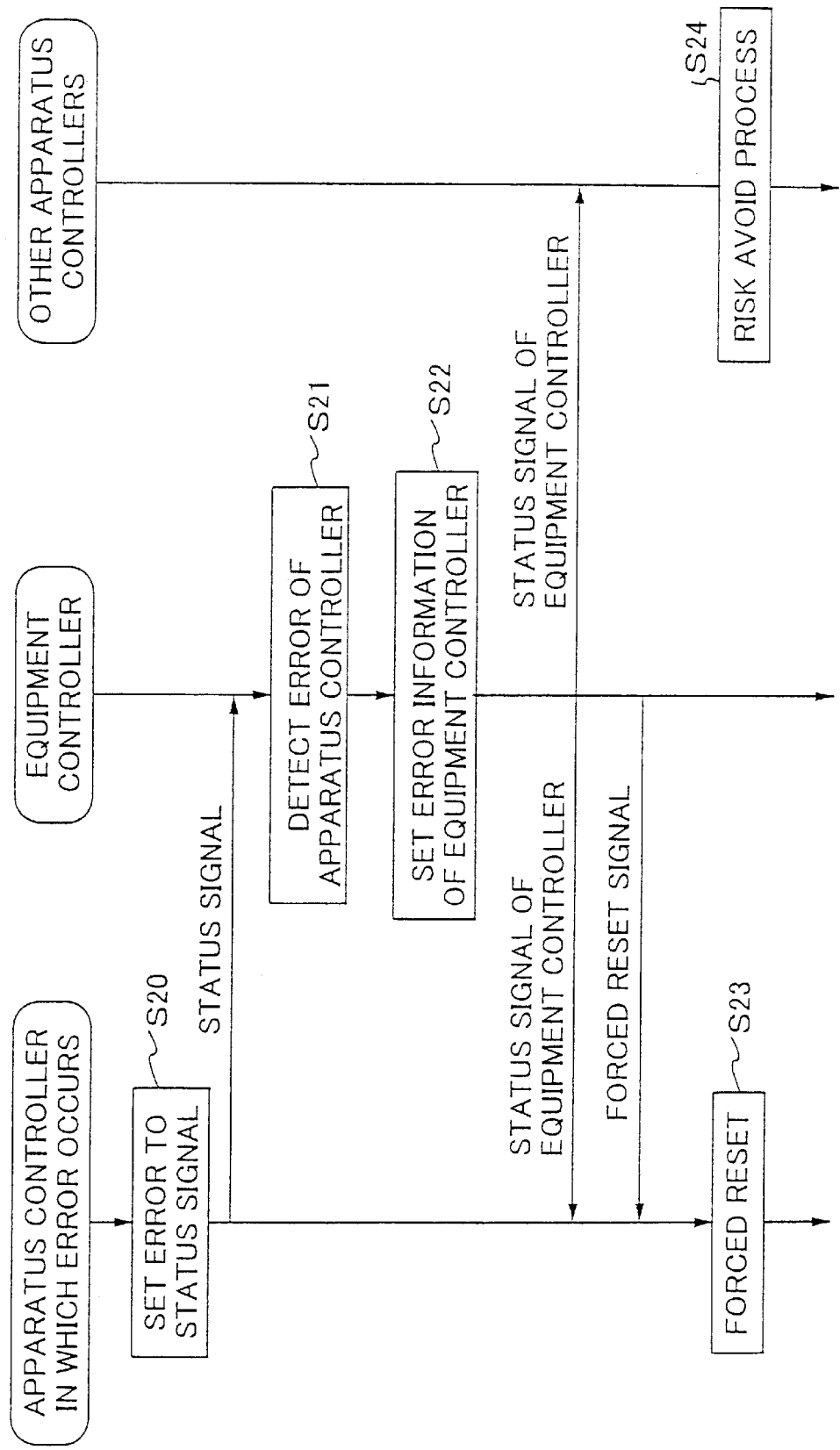

SEMICONDUCTOR MANUFACTURING APPARATUS DETECTING STATE OF CONNECTION BETWEEN CONTROLLERS

TECHNICAL FIELD

The present invention relates to a controller connected via a network and, more particularly, to a method of detecting a connection state between controllers of a multi-chamber system in a semiconductor manufacturing apparatus and a semiconductor manufacturing apparatus performing such a method.

BACKGROUND ART

Generally, a semiconductor manufacturing apparatus is provided with various processing chambers that carry out each process to manufacture a semiconductor device in combination. A conveyance mechanism which carries wafers is provided between processing chambers and between a cassette accommodating many wafers and the processing chambers. An apparatus controller is provided to a plurality of processing chambers and conveyance mechanisms so that a desired operation is performed according to the order specification of a semiconductor manufacturing apparatus or the purpose of the user's use.

The multi-chamber semiconductor manufacturing apparatus including a plurality of processing chambers and conveyance mechanism is provided with a plurality of apparatus controllers or a plurality of CPUs for control. In this case, it is desired to comprehensively control each apparatus controller so as to achieve a complicated work safely, reliably and efficiently. Then, a tightly-coupled type control system of a type, which carries out a bus connection of apparatus controllers to carry out an intensive control, is developed.

However, when the bus connection of each equipment controller is carried out, it is difficult to carry out a maintenance check of the apparatus controllers on an individual basis. Additionally, each apparatus controller and a corresponding processing chamber cannot be operated alone. Furthermore, it is difficult to detach the processing chambers freely.

Accordingly, in order to reduce a system down time, a loosely-coupled type control system has been developed in which apparatus controllers are connected via a network such as the Ethernet so that an individual maintenance and an individual control can be performed. The loosely-coupled type control system is provided with an equipment controller as an upper order controller with respect to the apparatus controller. The equipment controller generally controls the whole semiconductor manufacturing apparatus. In such a loosely-coupled type control system, communication between controllers is performed according to a communication protocol used in the network. Programs, parameter data, control information, etc. for operating the processing chambers and conveyance mechanism are transferred via a network.

When communicating between controllers via a network as mentioned above, it takes a time of an order of several seconds to several tens of seconds is needed (it is dependent on a design) until one controller checks whether a communication connection has been established between the other controller. Additionally, it is impossible fro one controller to distinguish whether the other controller is down or a malfunction occurs in the network when the communication connection cannot be established. Furthermore, an abnormal state of the controller cannot be checked unless it goes through the network. Moreover, it is also difficult to distinguish a case where the controller is not connected from a case where the controller is out of order.

Therefore, when a abnormality occurs in a certain controller or an abnormalities occurs in a network in the conventional control system of the semiconductor manufacturing apparatus in which a plurality of controllers are connected through the network, a time of an order of several seconds to several tens of seconds passes until one controller recognizes an occurrence of an abnormality in a remote controller or a network, that is, until it is determined that the communication connection cannot be established. However, other process chambers or the conveyance mechanism continue to perform regular operations during the time for determining the establishment of the communication connection, when the worst, an unexpected problem may occur in a worst case. Moreover, since it cannot specify whether the generation source of the abnormalities is a network or a controller, a trouble may occur in restoration.

DISCLOSURE OF INVENTION

It is a general object of the present invention to provide an improved and useful interlock system in which the above-mentioned problems are eliminated.

A more specific object of the present invention is to provide an interlock system which, when an abnormality occurs in a controller, can discriminate the controller in which the abnormality occurs in a control system of a semiconductor manufacturing apparatus in which a plurality of controllers are connected through a network.

In order to achieve the above-mentioned objects, there is provided according to the present invention a semiconductor manufacturing apparatus, comprising: a processing system containing at least one processing chamber which performs a semiconductor manufacturing process; a conveyance system which takes an object to be processed in and out of said processing chamber; and a control system including at least one apparatus controller, which controls said processing system and said conveyance system, and an equipment controller, which manages said apparatus controller, said apparatus controller and said equipment controller being communicably connected through a network, wherein the apparatus controller and the equipment controller, which are connected via the network, are also connected via a hard wire so as to transmit a status signal inside the apparatus controller and the equipment controller to the control system. Thereby, a presence of each apparatus controller and a status of connection between the controllers can be detected without using communication through the network.

The semiconductor manufacturing apparatus according to one aspect of the present invention is characterized in that said control system further includes a first path, which transmits a status signal of said apparatus controller to said equipment controller via a hard wire, and a second path, which transmits a status signal of said equipment controller to said apparatus controller via a hard wire.

The first path first path preferably includes a path, which transmits a status signal between the apparatus controller and other apparatus controllers. Thereby, since all apparatus controllers can acquire the status signal of other equipment controllers, each apparatus controller can take safety measures in accordance with a status of the control system.

Additionally, it is preferable that the equipment controller comprises means for determining whether or not a communication connection can be established between the apparatus controllers for a further process based on the status signal transmitted from the apparatus controller. Thereby, the equipment controller can avoid waste of time to be generated by trying communication connection between the apparatus controller with which a communication connection cannot be established.

Moreover, it is preferable that the apparatus controller comprises means for determining contents of a further process based on the status signal transmitted from the equipment controller. Thereby, the apparatus controller can electively carry out the safe measures at the time of abnormalities according to the status of the equipment controller or the state of the apparatus controller reflected in the status of the equipment controller.

Additionally, there is provided according to another aspect of the present invention a bootstrap method of a control system of a semiconductor manufacturing apparatus comprising: a processing system containing at least one processing chamber which performs a semiconductor manufacturing process; a conveyance system which takes an object to be processed in and out of said processing chamber; and said control system including a plurality of apparatus controllers, which control said processing system and said conveyance system, and an equipment controller, which manages said apparatus controllers, said apparatus controllers and said equipment controller being communicably connected through a network, characterized by comprising: a step of initializing said equipment controller; a step of detecting a status signal of each of said apparatus controllers connected to said equipment controller via a hard wire; a step of identifying an apparatus controller, which can load a program, from among said apparatus controllers based on the status signals of said apparatus controllers; a step of establishing a communication connection via said network between said equipment controller and said identified apparatus controller; a step of loading a program to be executed to said identified apparatus controller from said equipment controller via said network, and starting the program; a step of detecting the status signal of said identified apparatus controller connected to said equipment controller via a hard wire; and a step of determining whether or not said identified apparatus controller executed said program based on the status signal of said identified apparatus controller.

Thus, by the equipment controller acquiring the status signal of the apparatus controller to which the equipment controller is connected via the hard wire, the bootstrap can be appropriately and efficiently performed in accordance with the configuration of the control system.

Additionally, there is provided according to further aspect of the present invention an interlock method of a control system of a semiconductor manufacturing apparatus comprising: a processing system containing at least one processing chamber which performs a semiconductor manufacturing process; a conveyance system which takes an object to be processed in and out of said processing chamber; and said control system including a plurality of apparatus controllers, which control said processing system and said conveyance system, and an equipment controller, which manages said apparatus controllers, said apparatus controllers and said equipment controller being communicably connected through a network, characterized by comprising: a step of setting a status signal representing an abnormality in one of said apparatus controllers in which the abnormality occurs; a step of transmitting the status signal representing the abnormality of said one of said apparatus controllers to said equipment controller connected to said one of said apparatus controller via a hard wire; a step of transmitting the status signal-representing the abnormality from said equipment controller to all of said apparatus controllers connected to said equipment controller via a hard wire; and a step of performing an interlock operation in each of said apparatus controllers to which the status signal representing the abnormality is transmitted from said equipment controller via the hard wire.

Accordingly, since the apparatus controller can selectively perform the interlock operation when an abnormality is detected in the control system, operators can individually take safety measures in accordance with a condition such as moving to a safe position, waiting after returning a position to resume the operation or waiting at a position where a person can easily access.

Other objects, features and advantages of the present invention will become more apparent from the following detailed description when read in conjunction with the accompanying drawings.

BRIEF DESCRIPTION OF DRAWINGS

FIG. 8 is a sequence chart of an operation according to an interlock method of a control system of a semiconductor manufacturing apparatus according to a seventh embodiment of the present invention.

BEST MODE FOR CARRYING OUT THE INVENTION

Figure 1:
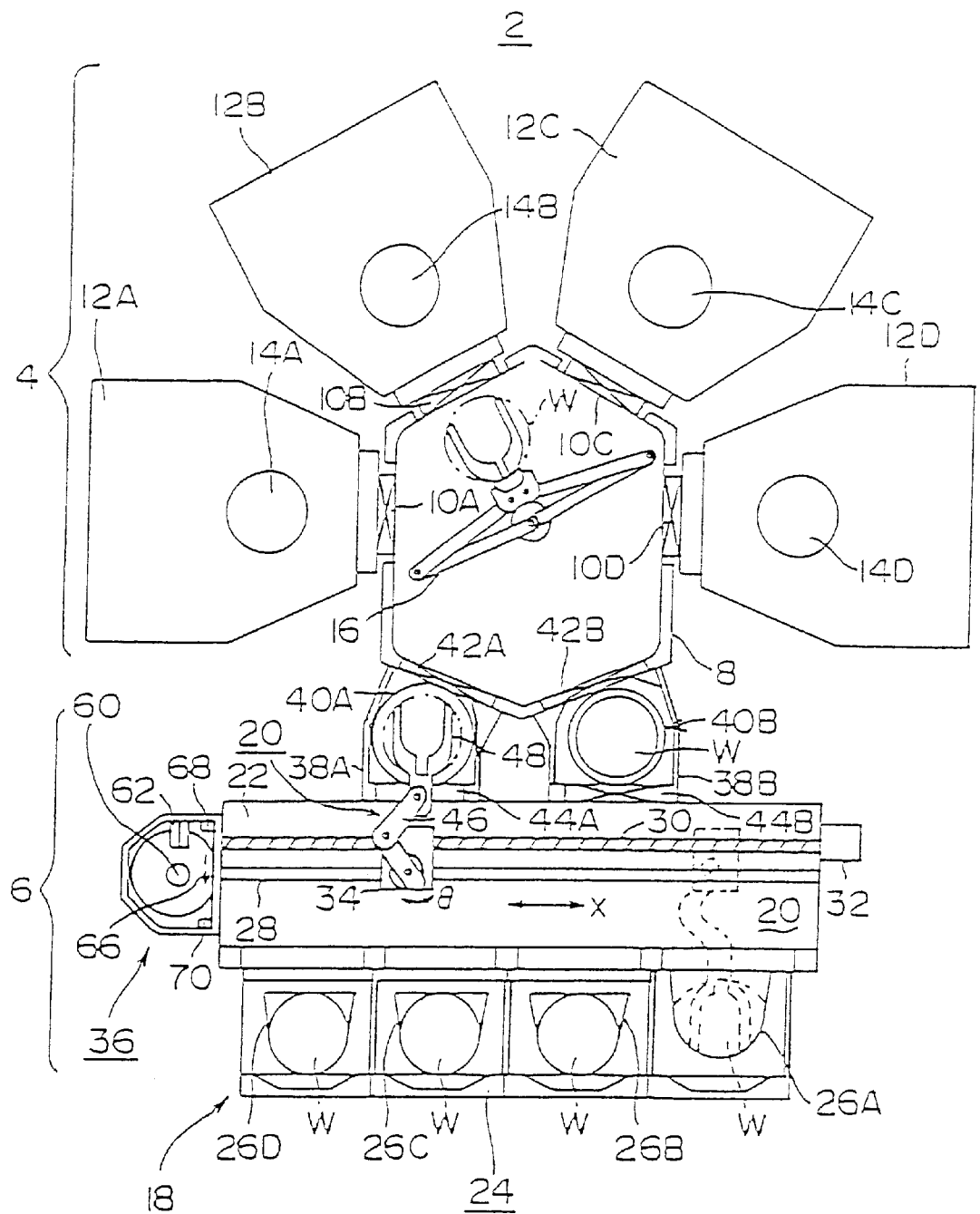
FIG. 1 is a figure showing a mechanism part of a semiconductor manufacturing apparatus according to a first embodiment of the present invention.

A description will now be given, with reference to the drawings, of embodiments of the present invention. In the drawings, equivalent parts are given the same reference numerals.

FIG. 1 is a plan view of a mechanism part of a semiconductor manufacturing apparatus according to a first embodiment of the present invention. A description will be given, with reference to FIG. 1, of the multi-chamber semiconductor manufacturing apparatus, especially, a cluster tool apparatus 2. The cluster tool apparatus 2 is constituted by a processing system 4, which applies various kinds of processes, such as a film deposition process, a diffusion process or an etching process, to a semiconductor wafer W as an object to be conveyed, and a conveyance system 6 which carries the wafer in and out of the processing system 4.

The processing system 4 comprises a transfer chamber 8, in which a vacuum can be crated, and four processing chambers 12A–12D connected to the transfer chamber 8 via respective gate valves 10A–10D. In the processing chambers 12A–12D, the same or different kinds of heat treatments are applied to the wafer W. Susceptors 14A–14D, on which the wafer W is placed, are provided in the respective chambers 12A–12D. A telescopic and pivotable transfer arm part 16 is provided in the transfer chamber 8. The transfer arm part 16 transfers the wafer between the chambers 12A–12D and a load lock chamber described later.

The conveyance system 6 comprises a cassette stage 18 on which a cassette container is placed and a conveyance stage 22 which moves a conveyance arm part 20 for delivering the wafer W. The cassette stage 24 is provided with a container table 24 so that a plurality of cassette containers (in this case, four containers at maximum) 26A–26D can be placed thereon. Each of the cassette containers 26A–26D is constituted so a maximum of 25 wafers W, for example, can be accommodated at equal pitches.

A guidance rail 28 extending along the longitudinal direction in the central part is provided in the conveyance stage 22. The above-mentioned conveyance arm part 20 is slidably supported by the guidance rail 28. The guidance rail 28 is provided with a ball screw 30 as a moving mechanism in a parallel manner. A base 34 of the above-mentioned conveyance arm part 20 is fitted to the ball screw 30. Accordingly, the conveyance arm part 20 is movable along the guidance rail 28 by driving a drive motor 32 provided on the end of the ball screw 30.

An orienter 36 is provided on the other end of the conveyance stage 22 as a directional positioning device which positions the wafer. Additionally, two load lock chambers 38A and 38B, in which a vacuum can be formed, are provided in the middle of the conveyance stage 22 so as to connect between the above-mentioned transfer chamber 8. In each of the load lock chambers 38A and 38B, a conveyed body tables 40A and 40B on which the wafer W is placed are provided. Additionally, gate valves 42A, 42B and 44A, 44B are provided in front and behind each of the load lock chambers 38A and 38B, the gate valves for communicating with the transfer chamber 8 or the conveyance stage 22.

The above-mentioned conveyance arm part 20 has a telescopic, multi-articulated conveyance arm body 46 and a fork 48 mounted on an end of the arm body 46. The wafer W is held directly on the fork 48.

The orienter 36 has a rotation reference stand 60, which is rotated by a drive motor. The rotation reference stand 60 rotates while the wafer W is placed thereon. An optical sensor 62 for detecting the circumferential edge of wafer W is provided in the periphery of the rotation reference stand 60. Moreover, a level detector is provided on the side of entrance of the orienter 36, the level detector consisting of a laser element 68 outputting a laser beam 66 for detection of the horizontal level and a light-receiving element 70 receiving the laser beam 66.

Figure 2:
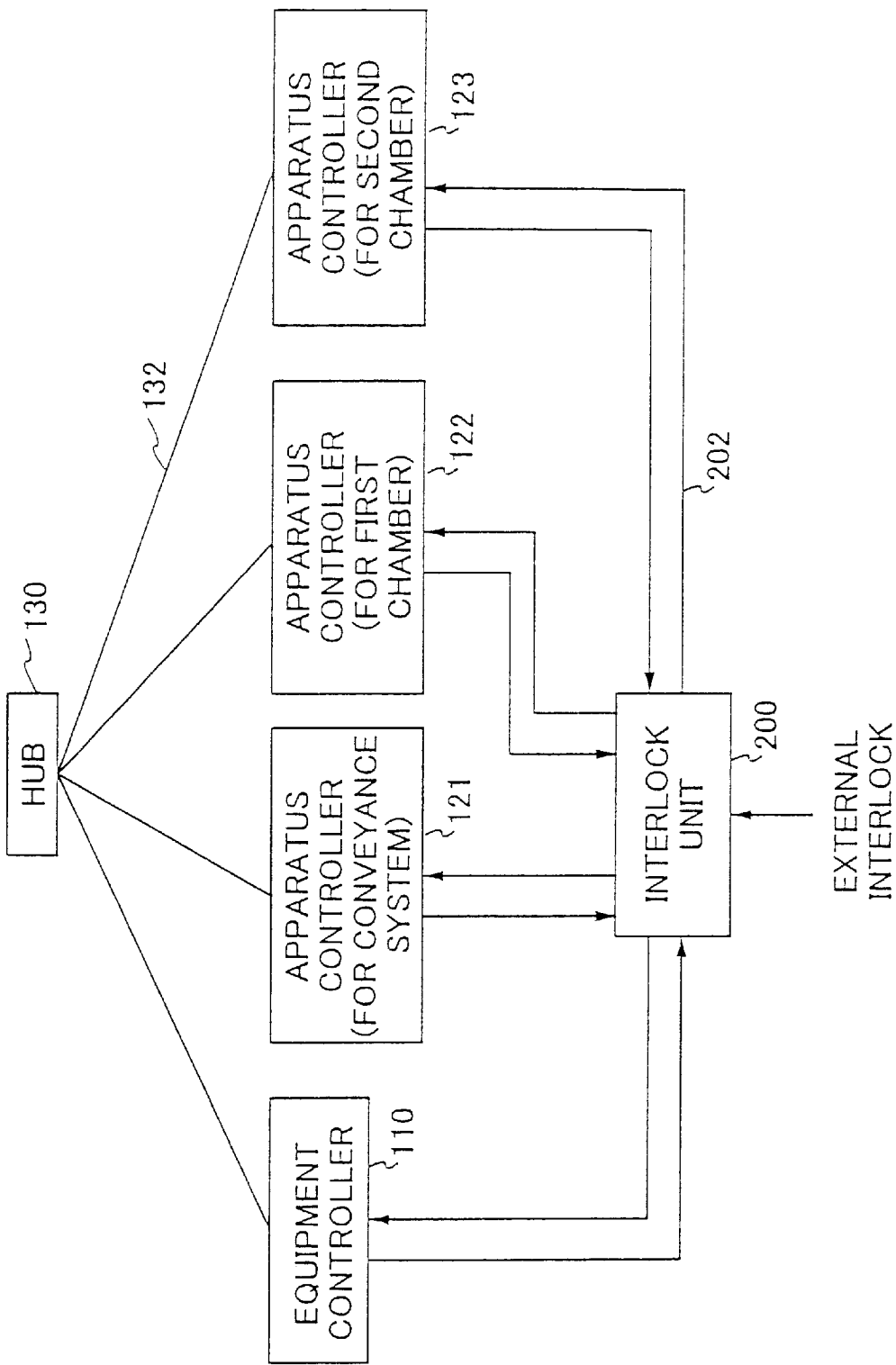
FIG. 2 is an illustrative structure diagram of a control system of the semiconductor manufacturing apparatus according to the first embodiment of the present invention.

The cluster tool apparatus 2 has an apparatus controller (not shown in the figure) which controls operation of the conveyance system. The apparatus controller controls conveyance of wafer W based on the information acquired in position information of axis and information acquired by each detection part FIG. 2 is a block diagram of a control system of the semiconductor manufacturing apparatus according to the first embodiment of the present invention. The control system comprises: an apparatus controller 121 which controls the conveyance system 6; an apparatus controller 122 which controls a first processing chamber which performs a single semiconductor manufacturing process such as a film deposition process; an apparatus controller 123 which controls a second processing chamber which performs a process such as a diffusion process; and apparatus controllers corresponding to respective process chambers. Additionally, the control system further comprise an equipment controller 110 which integrally manages information on the whole semiconductor manufacturing apparatus, and the equipment controller 110 may be connected to a host computer (not shown in the figure) of the factory in which, for example, the semiconductor manufacturing apparatus is installed.

The equipment controller 110 and the apparatus controllers 121, 122 and 123 are mutually connected through a network, typically a LAN type network 132 such as the Ethernet. The network 132 can be constituted for example, in a star type. FIG. 2 shows the star type network 132. At this time, the control system has a hub 130 which is a line concentrator, and the equipment controller 110 and the apparatus controllers 121, 122 and 123 are connected through the hub 130.

Programs executed by the apparatus controllers and parameters related to the programs are downloaded from the equipment controller 110 to each of the apparatus controllers 121, 122 and 123 through a network 132. Moreover, the measurement data under processing is uploaded from each of the apparatus controllers 121, 122 and 123 to the equipment controller 110.

Additionally, the control system according to the first embodiment of the present invention further comprises an interlock unit 200. The equipment controller 110 and the apparatus controllers 121, 122 and 123 are connected to the interlock unit 200 via a hard wire 202. The interlock unit 200 transmits a status signal of the controller through the hard wire 202. The status signal of the controller includes, for example, information indicating whether or not the preparation of hardware is completed and information indicating whether or not the preparation of software is completed. If the status signal of the controller indicates neither a software-ready state nor a hardware-ready state, this means that the software is not loaded to the controller or there is a software problem occurring in the controller.

As mentioned above, since the equipment controller 110 and the apparatus controllers 121, 122 and 123 are connected by the hard wire, and the status signal can be exchanged there between through the hard wire, connection state and operational state of other controllers can be detected without using communication through the network 132.

The interlock unit 200 comprises a first path and a second path, the first path transmitting the status signal of the above-mentioned apparatus controllers 121, 122 and 123 to the above-mentioned equipment controller 110 through the hard wire 202, the second path transmitting the status signal of the above-mentioned equipment controller 110 to the above-mentioned apparatus controllers 121, 122 and 123 through the hard wire 202.

Since the equipment controller 110 is able to know the status of all the apparatus controllers in the control system, the equipment controller 110 can determine its own status signal to be sent to the apparatus controllers based on the status signals received from each of the apparatus controllers 121, 122 and 123. The signal supplied to each of the controllers can be changed by changing the wiring method of the hard wire in the interlock unit 200.

For example, there is Dizzy chain connection only by the hard wire as an easily realizable form of the interlock unit 200. The Dizzy chain connection is an effective connection form, when the connection order of the apparatus controllers is fixed.

Additionally, the interlock unit 200 may receive an interlock signal from the exterior, and may be constituted to supply the interlock signal by combining with the status signal to each controller.

Figure 3:
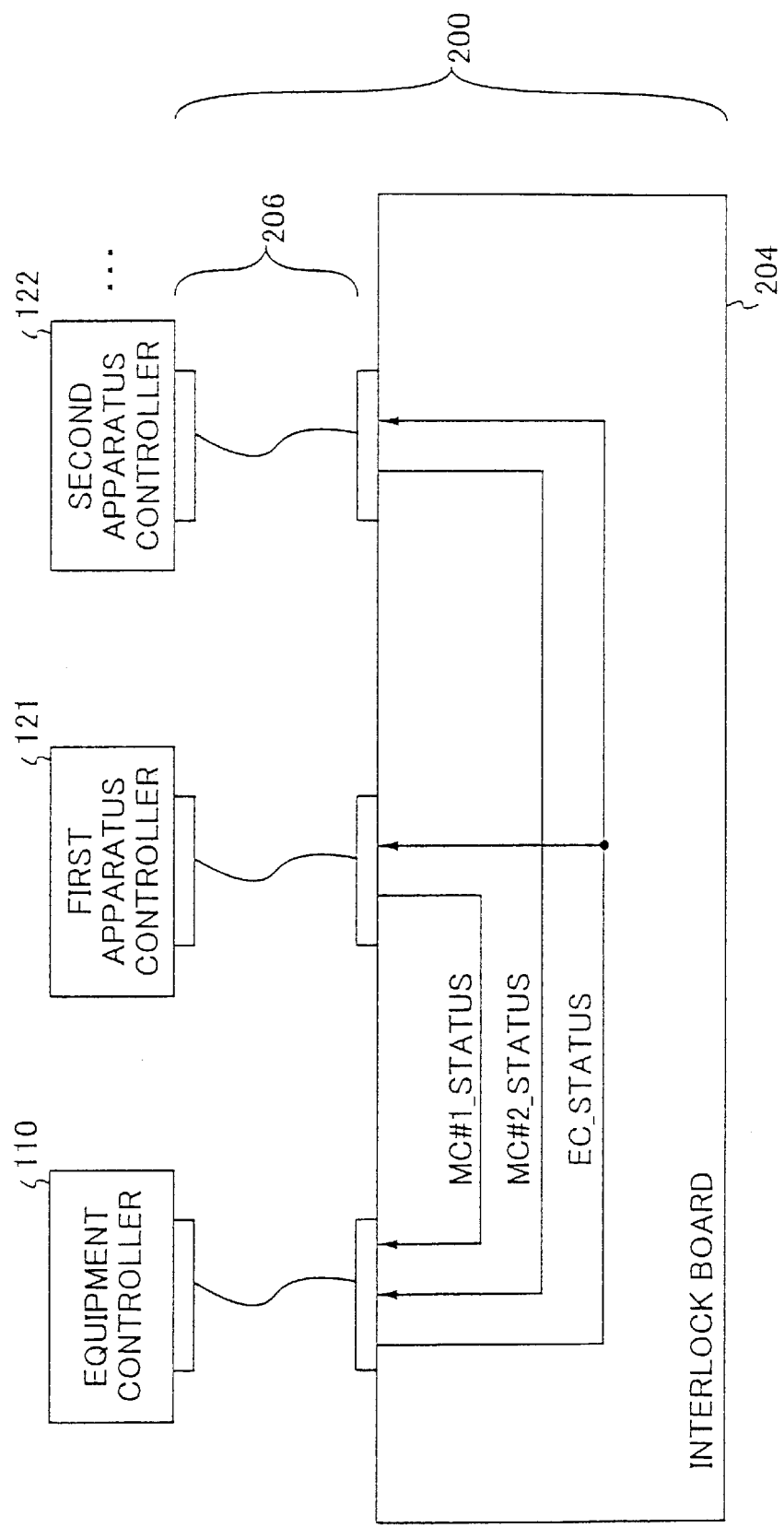
FIG. 3 is a diagram for explaining an interlock unit according to a second embodiment of the present invention.

FIG. 3 is a diagram of the interlock unit 200 according to a second embodiment of the present invention. In the present embodiment, on the equipment controller 110 and two apparatus controllers 121 and 122 are shown for the sake of simplification. However, the number of the apparatus controllers is not restricted. The interlock unit 200 comprises an interlock board 204 and a connector part 206. The equipment controller 110 and the two apparatus controllers 121 and 122 are connected by hardwire via the connector part 206 and the interlock board 204.

On the interlock board 204, a signal MC#1_STATUS, a signal MC#2_STATUS and a signal EC_STATUS represent the status signal of the first apparatus controller 121, the status signal of the second apparatus controller 12e and the status signal of the equipment controller 110, respectively. More specifically, the signal MC#1_STATUS includes a signal MC#1_HARD_RDY indicating the state of operation of the hardware and a signal MC#1_SOFT_RDY indicating the state of operation of the software of the first apparatus controller 121. Similarly, the signal MC#2_STATUS includes a signal MC#2_HARD_RDY indicating the state of operation of the hardware and a signal MC#2_SOFT_RDY indicating the state of operation of the software of the second apparatus controller 122.

On the other hand, the status signal EC_STATUS of the equipment controller 110 includes a signal EC_HARD_RDY indicating the state of operation of the hardware of the equipment controller 110, a signal EC_SOFT_RDY indicating the state of operation of the software of the equipment controller 110, and a signal MC_RSTn for forcibly resetting each apparatus controller. According to such a connection form, the status signal from all apparatus controllers is supplied to the equipment controller 110, and the status signal of the equipment controller 110 is supplied to all the apparatus controllers.

Figure 4:
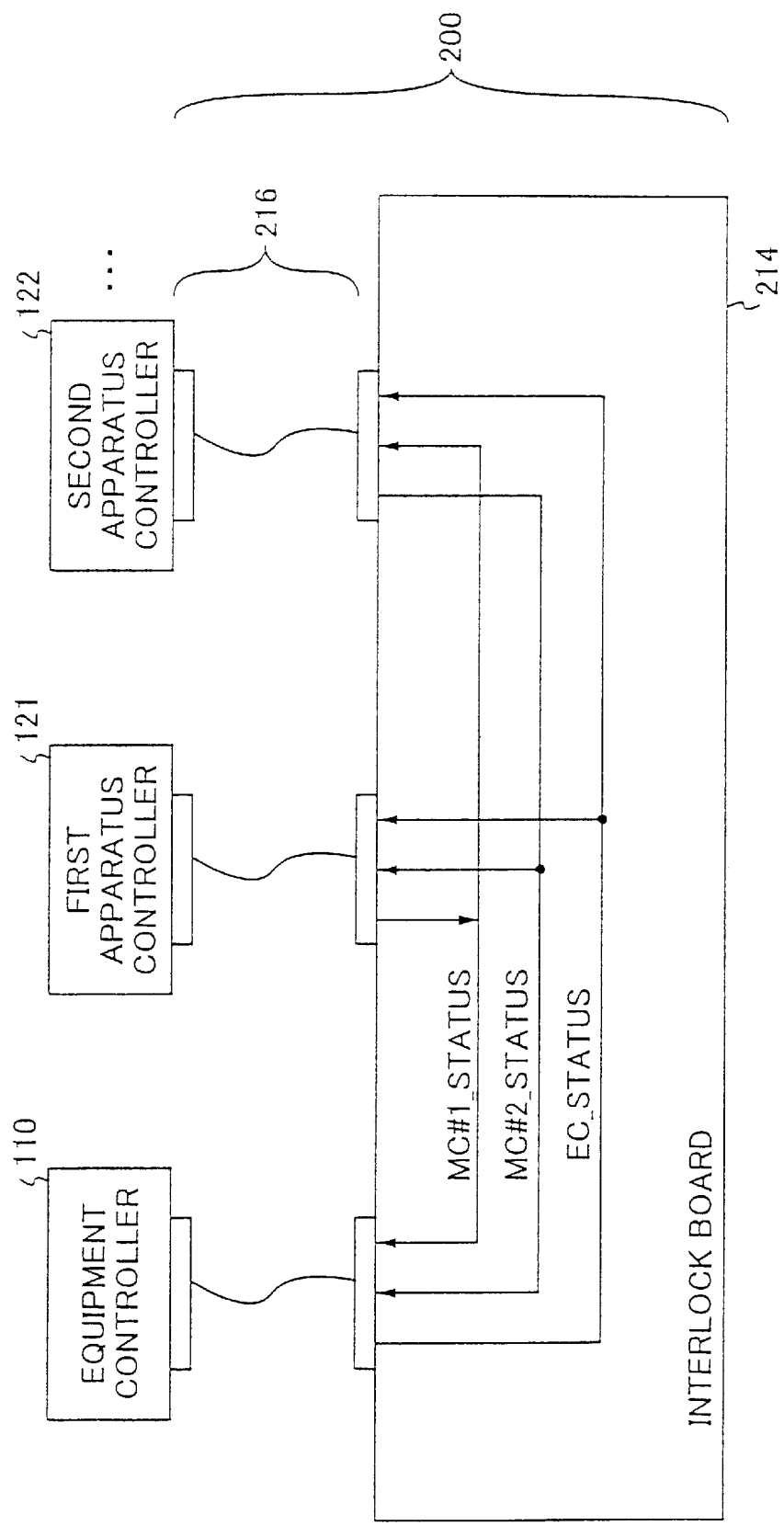
FIG. 4 is a diagram for explaining an interlock unit according to a third embodiment of the present invention.

FIG. 4 is a diagram of the interlock unit 200 according to a third embodiment of the present invention. In FIG. 4, only the equipment controller 110 and two apparatus controllers 121 and 122 are shown for the sake of simplification. However, the number of apparatus controllers is not restricted. The interlock unit 200 includes an interlock board 214 and a connector part 216, and the equipment controller 110 and the two apparatus controllers 121 and 122 are connected by a hard wire via the interlock board 214 and the connector part 216, The meaning of signals shown on the interlock board 214 is the same as that of the case of the interlock unit according to the second embodiment of the present invention explained with reference to FIG. 3. In the case of the present embodiment, the equipment controller 110 and all apparatus controllers are connected mutually. Moreover, the status signal of a certain controller is distributed to all other controllers. That is, the status signal about all other controllers is supplied to a certain controller.

Thereby, since all apparatus controllers can acquire the status signals of not only the equipment controller 110 but also other apparatus controllers, each apparatus controller can selectively perform operation according to the connection state.

Figure 5:
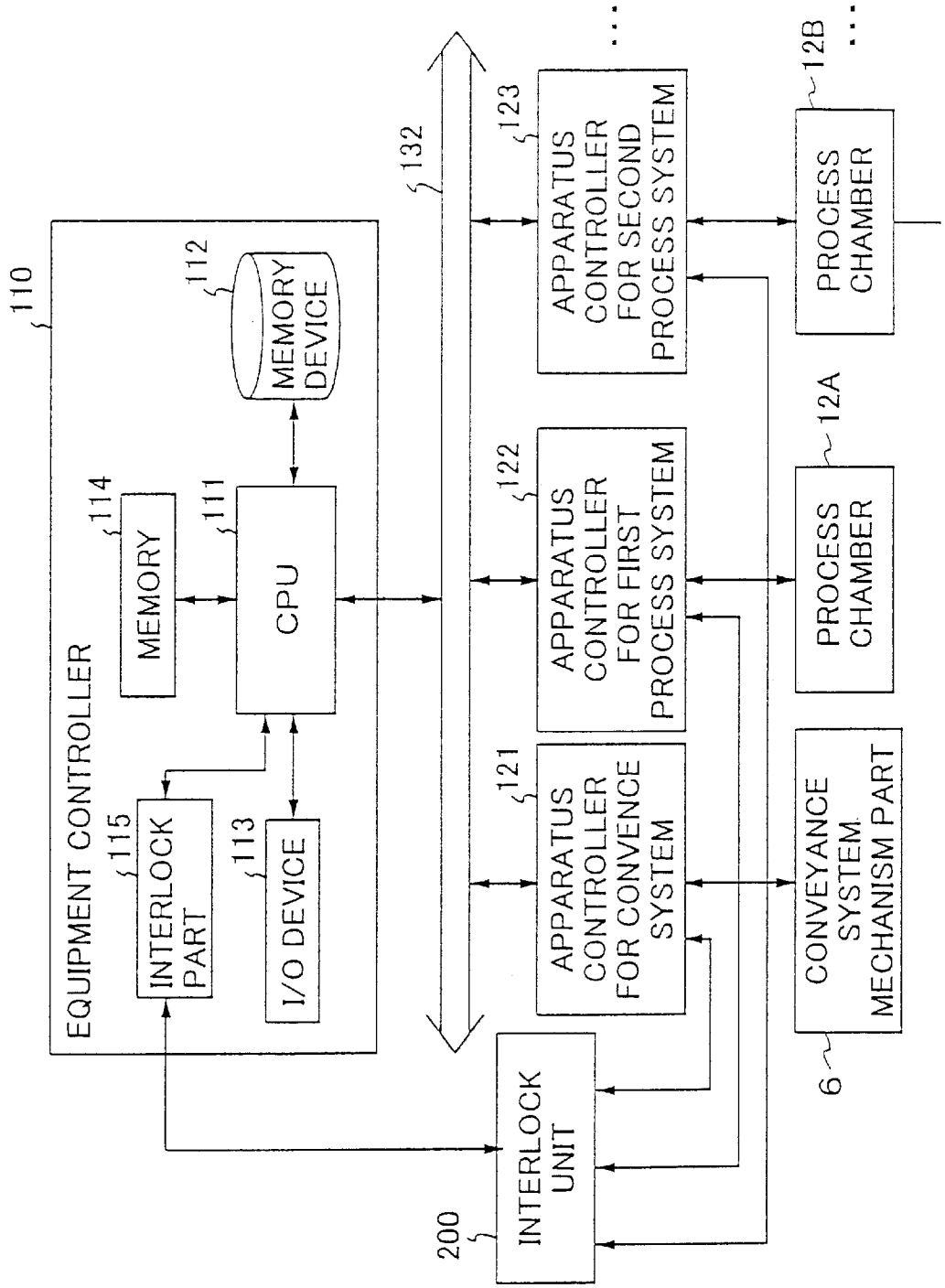
FIG. 5 is a structure diagram of an equipment controller according to a fourth embodiment of the present invention.

FIG. 5 is a structure diagram of the equipment controller 110 according to a fourth embodiment of the present invention. The equipment controller 110 is connected, via the network such as the Ethernet, to the apparatus controller 121 for the conveyance system, the apparatus controller for the first process chamber, and the apparatus controller 123 for the second process chamber. The apparatus controller 121 for the conveyance system, the apparatus controller for the first process chamber and the apparatus controller 123 for the second process chamber respectively control operations of the conveyance system mechanism part 6, the process chamber 12A and the process chamber 12B shown in FIG. 1.

The equipment controller 110 has a memory device 112 such as a hard disk unit, a floppy disk unit or an IC memory unit, and various kinds of information required for operation of the semiconductor manufacturing apparatus is stored in the memory device 112. That is, the memory device 112 stores, for example, the program for operation of the equipment controller 110, the apparatus operation program executed by the conveyance system apparatus controller 121 for operating the conveyance system and the corresponding apparatus operation condition parameters, the apparatus operation program executed by the apparatus controllers 122 and 123 for controlling the processes of the process chambers 122 and 123 and the corresponding apparatus operation condition parameters, the user's specific recipe, and the apparatus log data.

The equipment controller 110 has a CPU 111 for executing the above-mentioned programs, and downloads various kinds of information stored in the memory device 112 to the apparatus controllers 121, 122 and 123 through the network 132, or acquires various kinds of information from the apparatus controllers 121, 122 and 123, and stores the information in a memory 114 or the memory device 112. The equipment controller 110 further includes an input/output device 113 constituted by a display, a keyboard, etc., and a user can set up and edit various programs and parameters which are stored in the above-mentioned memory device 112 through the input/output device 113.

Additionally, according to a fourth embodiment of the present invention, the equipment controller 110 comprises an interlock part 115, and judges whether or not communication connection can be established for a further process between the above-mentioned apparatus controllers based on the status signal of each apparatus controller which is transmitted from the above-mentioned apparatus controllers 121, 122 and 123. Thereby, the equipment controller 110 can avoid waste of time caused by trying establishment of the communication connection between the apparatus controllers which cannot be establish. Moreover, the boot up of the apparatus controllers can be carried out, and the initialization process of the apparatus controllers which downloads a program can be efficiently performed.

Figure 6:
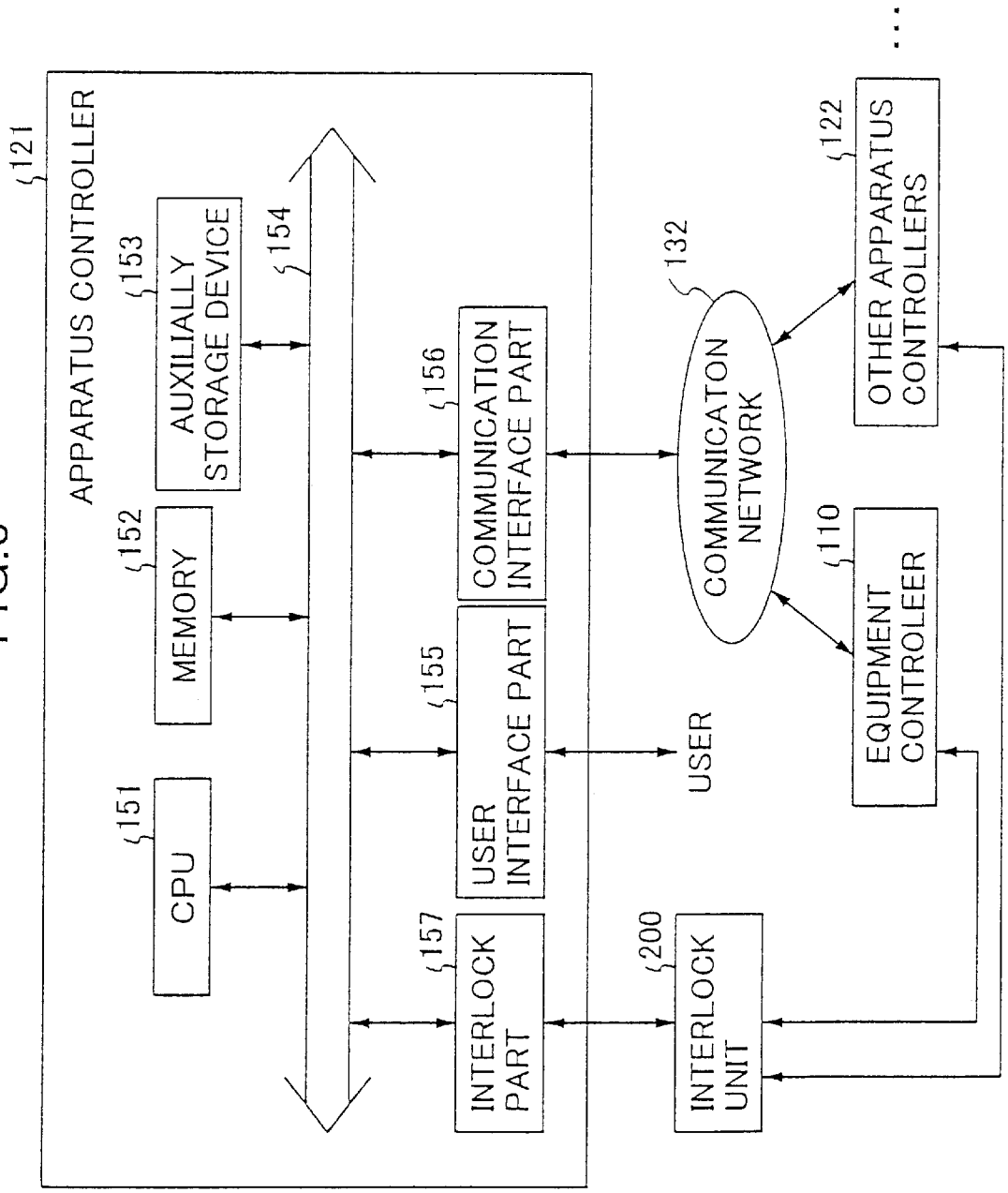
FIG. 6 is a composition figure of an apparatus controller according to a fifth embodiment of the present invention.

FIG. 6 is a block diagram of an apparatus controller (for example, a conveyance system for a conveyance system) 121 according to a fifth embodiment of the present invention. The apparatus controller 121 has a memory 152 constituted by a flash memory, EPROM, EEROM, etc. The memory 152 stores an apparatus control program. Moreover, apparatus operation condition parameters are developed on the memory 152. A CPU151 controls the apparatus by executing the apparatus control program stored in the memory 152 by referring to the execution values of the apparatus operation condition parameters developed on the memory 152. The apparatus controller 121 further includes an auxiliary memory device 153 constituted by a memory card and a card reader. The auxiliary memory device 153 stores information for later use. Moreover, the apparatus controller 121 includes a user interface part 155 having an input part and a display part. Through the user interface part 155, a user can issue instructions to the apparatus controller 121, or can see the message from the apparatus controller 121. Furthermore, the apparatus controller 121 includes a communication interface part 156 connected to the communication network, and can exchange information between the equipment controller 110 and other apparatus controllers 122 and 123.

According to the fifth embodiment of the present invention, the apparatus controller 121 has an interlock part 157 connected to the interlock unit 200, and the interlock part 157 judges the contents of a further process based on the status signal of the equipment controller acquired from the equipment controller 110 through the interlock unit 200. The contents of a further process to be judged may include continuation of a process, interruption of a process, restart of a process, move to a safe position, immediate stop, etc. Thereby, the apparatus controller 121 can electively take safety measures at the time of abnormalities according to the state of the equipment controller 110 or the state of other apparatus controllers such as the apparatus controller 122 which is reflected in the state of the equipment controller 110.

Figure 7:
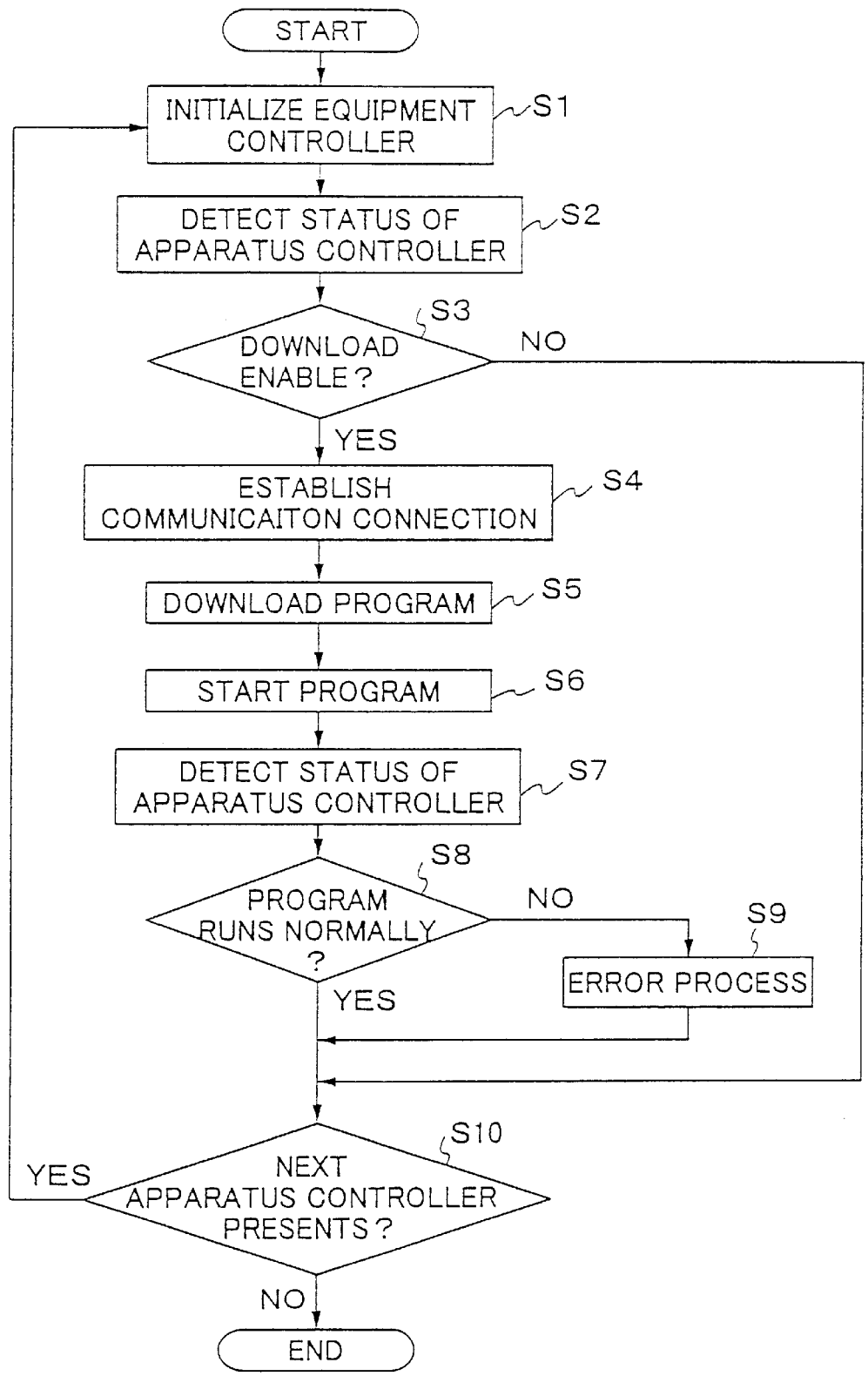
FIG. 7 is a flowchart of a bootstrap method of a control system of a semiconductor control device according to a sixth embodiment of the present invention. operation of this invention of operation.

FIG. 7 is a flowchart of operation according to a bootstrap method of a control system of a semiconductor manufacturing apparatus according to the sixth embodiment of the present invention. The present embodiment is an example which realizes the sequence in which an equipment controller downloads a program for an apparatus controller from the equipment controller after a power is turned on.

After a power is turned on, the equipment controller initializes the equipment controller (Step 1). Then, the status signal of the apparatus controller connected to the equipment controller through the hard wire is detected (Step 2). Next, based on the status signal, an apparatus controller, which is in a state in which a program can be loaded, is discriminated from among the apparatus controllers (Step 3). The state in which a program load is possible is equivalent to the state where a signal MC_SOFT_RDY indicating an operational state of the hardware in the status signal of the apparatus controller is turned ON, and a signal MC_HARD_RDY indicating an operational state of the software in the status signal of the apparatus controller is turned OFF.

Next, the equipment controller establishes the communication connection through a network between the discriminated apparatus controller (Step 4). Then the program, which is performed by the discriminated apparatus controller, is downloaded from the equipment controller to the apparatus controller (Step 5). Then, the program downloaded to the apparatus controller through the network is performed (Step 6).

In order to acquire the state of operation of the discriminated apparatus controller, the equipment controller detects the status signal of the apparatus controller connected through the hard wire (Step 7). Since the communication connection is established between the equipment controller and the apparatus controller in this stage, the equipment controller can also acquire the state of the apparatus controller through the network. However, it is preferable to detect the status signal through the hard wire from the viewpoint of reducing a process time.

Next, it is judged whether or not the apparatus controller normally executes the downloaded program (Step 8). When the signal MC_SOFT_RDY is ON and the signal MC_HARD_RDY is ON, it is judged that the apparatus controller is normally operated according to the downloaded program.

When it is judged that the apparatus controller is normally operated, the equipment controller advances the process to Step 10 so as to judge whether or not there is an apparatus controller which has not been processed (Step 10). When such an apparatus controller still exists, the process returns to Step 2. When the process is ended about all apparatus controllers, the series of sequence is ended.

On the other hand, if it is judged that the apparatus controller does not normally execute the downloaded program, the signal MC_RST for forcibly resetting is given to the apparatus controller from the equipment controller so as to recover the error state of the apparatus controller (Step 9).

Thus, by acquiring the status signal of the apparatus controller to which the equipment controller is connected by the hard wire connection, an equipment controller can download the program for the apparatus controller in the control system, and is able to have the apparatus controller to perform the program. Thereby, a bootstrap can be appropriately and efficiently performed in accordance with the configuration of the control system.

FIG. 8 is a sequence chart of an interlock method of an operation of a control system of a semiconductor manufacture equipment according to the seventh embodiment of the present invention. A description will now be give, with reference to FIG. 8, of a method of interlocking when an error occurs in a certain apparatus controller.

First, if software-fault occurs in an apparatus controller, an error on the software is detected using a well-known technique such as a watch-dog timer. Then, a software ready signal MC_SOFT_RDY of the apparatus controller is changed to OFF (Step 20). This signal is transmitted to the equipment controller through the hard wire.

The equipment controller detects that it is not ready with respect to software from the status signal of the apparatus controller (Step 21). Other apparatus controllers are notified that a software problem occurs in the system by the soft ready signal MC_SOFT_RDY of the equipment controller being turned OFF, and a forcible reset signal is transmitted through the hard wire to the apparatus controller in which the error occurs (Step 22). The apparatus controller of an error generation source which received the forcible reset signal through the hard wire performs the forcible reset process, and wait for next instruction (Step 23).

On the other hand, upon reception of the status signal of the equipment controller, other apparatus controllers perform, on an individual controller basis, a suitable risk-aversion process (for example, stop after going on to a safe place or process), and waits for next instruction (Step 24). Thereby, high speed and high safety interlocking operation using a hard wire can be realized when an error occurs.

It should be noted that, in the present embodiment, when the software error of an apparatus controller is detected, other apparatus controllers are notified of the occurrence of the error by changing the status signal of the equipment controller. However, for example, if the hard wire connection of the status signal is mutually made for every apparatus controller, then all apparatus controllers can recognize directly the apparatus controller in which the error occurs. As a result, the risk-aversion process according to the error generation source can be taken.

Thereby, since the apparatus controllers can selectively perform an interlock operation on an individual controller basis when an abnormality is detected in the control system, safety measures can be taken individually in accordance with a situation, such as moving to a safe place, waiting after returning to a position where a restart can be made or waiting in a state in which a person can easily access.

As mentioned above, in the semiconductor manufacturing apparatus according to the present invention, the equipment controller and the apparatus controllers, which are connected through the network, are also connected by the hard wire, and the status signal of the apparatus controllers and the equipment controller are transmitted to the control system. Thereby, within a control system, the existence and a state of operation of each apparatus controller and the connection state between controllers can be detected according to the status signal, without using communication through the network. Therefore, since an abnormality of the controller or an abnormality of the network can be detected within a time which is not an order of a time (several seconds or some dozens of seconds) required for establishment of the network communication but an order of less than 1 second, an immediate response can be taken with respect to an occurrence of the abnormality and a required measure can be taken. Since the status signal of the equipment controller or all apparatus controllers can be supplied to each apparatus controller via the hard wire, each apparatus controller can immediately take safety measures on an individual controller basis.

The present invention is not limited to the specifically disclosed embodiments, and variations and modifications may be made without departing from the scope of the present invention.

What is claimed is:

1. A semiconductor manufacturing apparatus, comprising:
    a processing system containing at least one processing chamber which performs a semiconductor manufacturing process;
    a conveyance system which takes an object to be processed in and out of said processing chamber; and
    a control system including at least one apparatus controller, which controls said processing system and said conveyance system, and an equipment controller, which manages said apparatus controller, said apparatus controller and said equipment controller being communicably connected through a network,
    wherein:
        said control system further includes a first path, which transmits a status signal of said apparatus controller to said equipment controller via a hard wire, and a second path, which transmits a status signal of said equipment controller to said apparatus controller via a hard wire, and
        wherein the first path and the second oath are separate from communication oaths of said network.

2. The semiconductor manufacturing apparatus as claimed in claim 1, wherein said first path includes a path which transmits a status signal between said apparatus controller and other apparatus controllers.

3. The semiconductor manufacturing apparatus as claimed in claim 2, wherein said equipment controller comprises means for determining whether or not a communication connection can be established between said apparatus controllers for a further process based on the status signal transmitted from said apparatus controller.

4. The semiconductor manufacturing apparatus as claimed in claim 2, wherein said apparatus comprises means for determining contents of a further process based on the status signal transmitted from said equipment controller.

5. The semiconductor manufacturing apparatus as claimed in claim 1 wherein said equipment controller comprises means for determining whether or not a communication connection can be established between said apparatus controllers for a further process based on the status signal transmitted from said apparatus controller.

6. The semiconductor manufacturing apparatus as claimed in claim 5, wherein said apparatus comprises means for determining contents of a further process based on the status signal transmitted from said equipment controller.

7. The semiconductor manufacturing apparatus as claimed in claim 1 wherein said apparatus comprises means for determining contents of a further process based on the status signal transmitted from said equipment controller.

8. A bootstrap method for a control system of a semiconductor manufacturing apparatus comprising:
    a processing system containing at least one processing chamber which performs a semiconductor manufacturing process;
    a conveyance system which takes an object to be processed in an out of said processing chamber; and
    said control system including a plurality of apparatus controllers, which control said processing system and said conveyance system, and an equipement controller, which manages said apparatus controllers, said apparatus controllers and said equipment controller being communicably connected through a network, the method comprising:
        a step of initializing said equipment controller;
        a step of detecting a status signal of each of said apparatus controllers connected to said equipment controller via a hard wire;
        a step of identifying an apparatus controller, which can load a program, from among said apparatus controllers based on the status signals of said apparatus controllers;
        a step of establishing a communication connection via said network between said equipment controller and said identified apparatus controller;
        a step of loading a program to be executed to said identified apparatus controller from said equipment controller via said network, and starting the program;
        a step of detecting the status signal of said identified apparatus controller connected to said equipment controller via a hard wire; and
        a step of determining whether or not said identified apparatus controller executed said program based on the status signal of said identified apparatus controller.

9. An interlock method for a control system of a semiconductor manufacturing apparatus comprising:
    a processing system containing at least one processing chamber which performs a semiconductor manufacturing process;
    a conveyance system which takes an object to be processed in and out of said processing chamber; and
    said control system including a plurality of apparatus controllers, which control said processing system and said conveyance system, and an equipment controller, which manages said apparatus controllers, said apparatus controllers and said equipment controller being communicably connected through a network, the method comprising:

a step of setting a status signal representing an abnormality in one of said apparatus controllers in which the abnormality occurs;

a step of transmitting the status signal representing the abnormality of said one of said apparatus controllers to said equipment controller connected to said one of said apparatus controllers via a hard wire;

a step of transmitting the status signal representing the abnormality from said equipment controller to all of said apparatus controllers connected to said equipment controller via a hard wire; and a step of performing an interlock operation in each of said apparatus controllers to which the status signal representing the abnormality is transmitted from said equipment controller via the hard wire.

* * * * *